United States Patent
Kowaguchi

[11] Patent Number: 5,839,077
[45] Date of Patent: Nov. 17, 1998

[54] RADIO TRANSMISSION SYSTEM COMPRISING A MASTER STATION AND SLAVE STATIONS, EACH COMPRISING AN ERROR CORRECTING SECTION INCLUDING ERROR CORRECTING METHODS

[75] Inventor: Satoshi Kowaguchi, Tokyo, Japan

[73] Assignee: NEC Corporation, Tokyo, Japan

[21] Appl. No.: 727,917

[22] Filed: Oct. 9, 1996

[30] Foreign Application Priority Data

Oct. 14, 1995 [JP] Japan ................................ 7-292083

[51] Int. Cl.⁶ .............................. H04B 7/00; H04Q 7/20
[52] U.S. Cl. ........................ 455/517; 455/67.3; 455/69; 371/41
[58] Field of Search ................ 371/41; 455/69, 455/88, 68, 63, 67.1, 67.3, 422, 9, 517, 70

[56] References Cited

U.S. PATENT DOCUMENTS

| 3,668,631 | 6/1972 | Griffith et al. | ........ 371/41 |
| 5,444,719 | 8/1995 | Cox et al. | ........ 371/41 |

FOREIGN PATENT DOCUMENTS

| 0 188 271 A2 | 7/1986 | European Pat. Off. . |
| 0 417 739 A2 | 3/1991 | European Pat. Off. . |
| 0 727 891 A2 | 8/1996 | European Pat. Off. . |
| 3-71739 | 3/1991 | Japan . |
| 5-175915 | 7/1993 | Japan . |
| 2 131 253 | 6/1984 | United Kingdom . |
| 2 160 392 | 12/1985 | United Kingdom . |
| 2 232 043 | 11/1990 | United Kingdom . |
| 2 291 570 | 1/1996 | United Kingdom . |

*Primary Examiner*—Nguyen Vo
*Attorney, Agent, or Firm*—Scully, Scott, Murphy & Presser

[57] ABSTRACT

In a radio transmission system having a master station and plural slave stations connected to the master station via a radio transmission path, the master station has a master error correcting section including plural master error correcting methods and each of the slave stations has a slave error correcting section including plural slave error correcting methods identical with the master error correcting methods. A detection section detects an upward error rate for an upward transmission path to produce a detected error rate. A monitoring section compares the detected error rate with a predetermined reference value to produce degradation information when the detected error rate is larger than the predetermined reference value. Responsive to the degradation information, a master switching section supplies the master error correcting section with a switch control signal. A master radio section sends the switch control signal via a downward transmission path to the slave stations. In each of the slave stations, a slave radio section receives the switch control signal to produce a received switch control signal. A slave switching section supplies the slave error correcting section with the received switch control signal.

8 Claims, 3 Drawing Sheets

RADIO TRANSMISSION SYSTEM COMPRISING A MASTER STATION AND SLAVE STATIONS, EACH COMPRISING AN ERROR CORRECTING SECTION INCLUDING ERROR CORRECTING METHODS

BACKGROUND OF THE INVENTION

This invention relates to a radio transmission system comprising a master station and a plurality of slave stations connected to the master station via a radio transmission path.

In general, a radio transmission system comprises a master station and a plurality of slave stations connected to the master station via a radio transmission path. The master station is called a main station while the slave stations are called sub stations. The radio transmission system may be an MCA system or a mobile communication system. The MCA system comprises a repeater station as the master station and as the slave stations a plurality of mobile stations and a plurality of fixed stations. The mobile communication system comprises a base station as the master station and a plurality of mobile stations as the slave stations. The radio communication path consists of an upward transmission path from the slave stations to the master station and a downward transmission path from the master station to the slave stations.

In the radio transmission system, it is needed to maintain good line quality of the radio transmission path because the radio transmission path degrades due to the influence of delay dispersion or the like. For that purpose, it is necessary in the radio communication system to carry out suitable control for degradation of line quality by monitoring situation of the line quality in the master station.

Various control methods of the type are already proposed. By way of example, a control method is disclosed in Japanese Unexamined Patent Prepublication of Kôkai No. Hei 5-175,915, namely, 175,915/1993 entitled "AUDIO DATA TRANSMITTER". The audio data transmitter according to Kôkai No. Hei 5-175,915 comprises error correction coding circuits at a transmission side and error correction decoding circuits at a reception side. At the transmission side, a transmission bit rate ratio of an audio coding bit rate in an audio coding circuit and an error correction coding bit rate in the error correction coding circuits is selected on the basis of the line quality. At the reception side, the transmission bit rate ratio is determined and a reception bit rate ratio is changed on the basis of the line quality. Thus, it is possible to obtain the audio data having a constant quality although the line quality is degraded.

Another control method is disclosed in Japanese Unexamined Patent Prepublication of Kôkai No. Hei 3-71,739, namely, 71,739/1991 entitled "ADAPTIVE ERROR CONTROLLER". In the adaptive error controller according to Kôkai No. Hei 5-175,915, a data transmission is carried out by selecting one of an error correction control by means of retransmission and another error correction control using a redundant code in response to a line bit error rate. Thus, efficient transmission is carried out.

The error correction control proposed in the latter prepublication is effective in a wired transmission path but is not preferable to apply to the radio transmission path. This is because there is risk the situation of the line quality being degraded in the radio transmission path on retransmission. The error correction control proposed in the former prepublication is preferable to apply to the radio transmission path. Inasmuch as the former prepublication adopts the error correction control based on a single correction method so as to change the bit rate ratio, there is a case where it is impossible to comply with causes of various degradations for the line quality of the radio transmission path. In this case, the bit rate ratio falls in vain and then the transmission efficiency falls extremely.

SUMMARY OF THE INVENTION

It is therefore an object of this invention to provide a radio transmission system which is capable of realizing error correction control complying with causes of various degradations for line quality of a radio transmission path without fall of transmission efficiency in vain.

Other objects of this invention will become clear as the description proceeds.

On describing the gist of this invention, it is possible to understand that a radio transmission system comprises a master station and a plurality of slave stations connected to the master station via a radio transmission path.

According to an aspect of this invention, each of the master station and the slave stations comprises error correcting means which includes a plurality of error correcting methods. Connected to the error correcting means, selection means selects one of the error correcting methods in accordance with a line quality of the radio transmission path.

On describing the gist of this invention, it is possible to understand that a radio transmission system comprises a master station and a plurality of slave stations connected to the master station via a radio transmission path. The radio transmission path consists of an upward transmission path from the slave stations to the master station and a downward transmission path from the master station to the slave stations.

According to another aspect of this invention, the master station comprises detection means for detecting an upward error rate for the upward transmission path to produce a detected error rate and master error correcting means including a plurality of master error correcting methods. Connected to the detection means, comparison means compares the detected error rate with a predetermined reference value to produce degradation information when the detected error rate is larger than the predetermined reference value. Connected to the comparison means and the master error correcting means, master switching means supplies the master error correcting means with a switch control signal in response to the degradation information to make the master error correcting means switch the master error correcting methods from one to another. Connected to the master switching means, sending means sends the switch control signal via the downward transmission path to the slave stations. Each of the slave stations comprises reception means for receiving the switch control signal to produce a received switch control signal and slave error correcting means including a plurality of slave error correcting methods which are identical with the master error correcting methods. Connected to the reception means and the slave error correcting means, slave switching means supplies the slave error correcting means with the received switch control signal to make the slave error correcting means switch the slave error correcting methods from one to another.

DESCRIPTION OF THE PREFERRED EMBODIMENT

Figure 1:
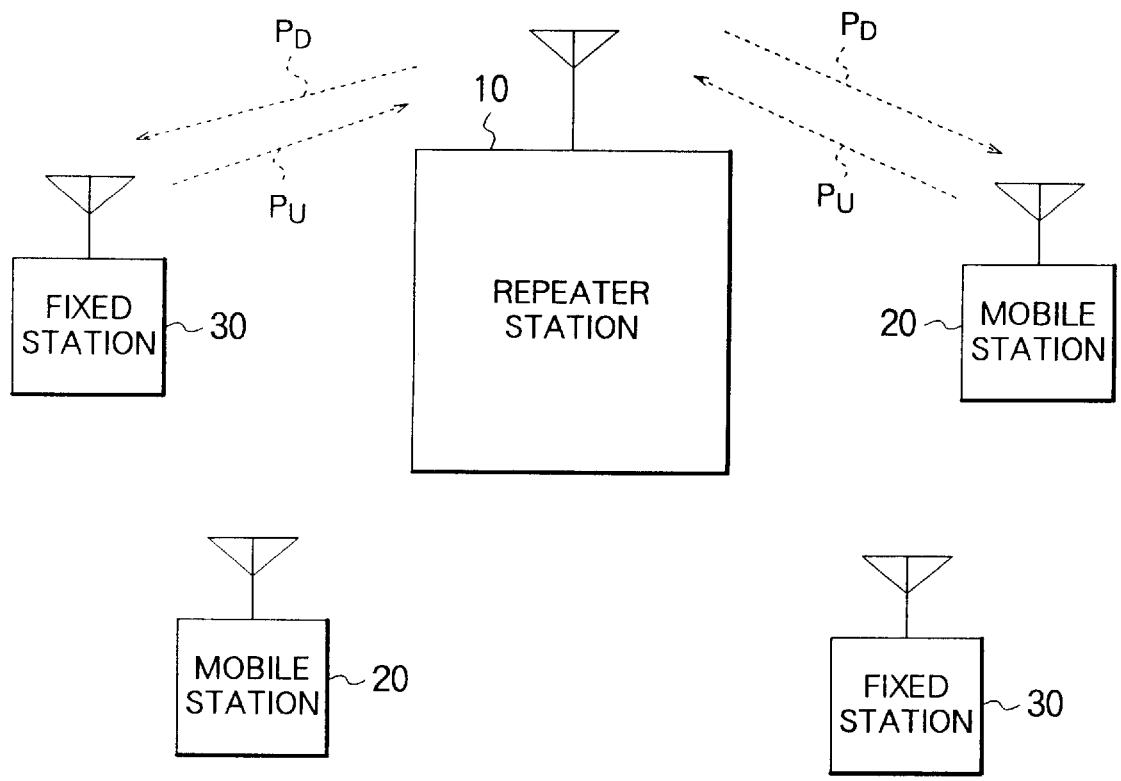
FIG. 1 is a block diagram of a radio communication system according to an embodiment of this invention.

Referring to FIG. 1, a radio transmission system to which this invention is applicable will be described. The radio transmission system comprises a master station and a plurality of slave stations connected to the master station via a radio transmission path.

In the example being illustrated, the radio transmission system is of a large zone type such as a multichannel access (MCA) system. The illustrated radio transmission system comprises a repeater station 10 as the master station and, as the slave stations, a plurality of mobile stations 20 (two mobile stations are illustrated in FIG. 1) and a plurality of fixed stations 30 (two fixed stations are illustrated in FIG. 1). The repeater station 10 is referred to a relay station. The radio transmission path consists of an upward transmission path $P_U$ from the slave stations (the mobile stations 20 and the fixed stations 30) to the master station (the repeater station 10) and a downward transmission path $P_D$ from the master station (the repeater station 10) to the slave stations (the mobile stations 20 and the fixed stations 30).

In the manner which will later become clear, the repeater station 10 comprises a master error correcting section including a plurality of master error correcting methods while each of the mobile stations 20 and the fixed stations 30 comprises a slave error correcting section including a plurality of slave error correcting methods which are identical with the master error correcting methods. The repeater station 10 receives a signal from the mobile stations 20 and the fixed stations 30 via the upward transmission path $P_U$ and detects an upward error rate for the upward transmission path $P_U$ to produce a detected error rate. The repeater station 10 switches master error correcting methods from one to another on the basis of the detected error rate. Simultaneously, the repeater station 10 sends a switch control signal via the downward transmission path $P_D$ to the mobile stations 20 and the fixed stations 30. Each of the mobile stations 20 and the fixed stations 30 receives the switch control signal to produce a received switch control signal. Each of the mobile stations 20 and the fixed stations 30 switches the slave error correcting methods from one to another on the basis of the received switch control signal. Thereafter, each of the mobile stations 20 and the fixed stations 30 carries out radio transmission to the repeater station 10 in accordance with a switched slave error correcting method.

Figure 2:
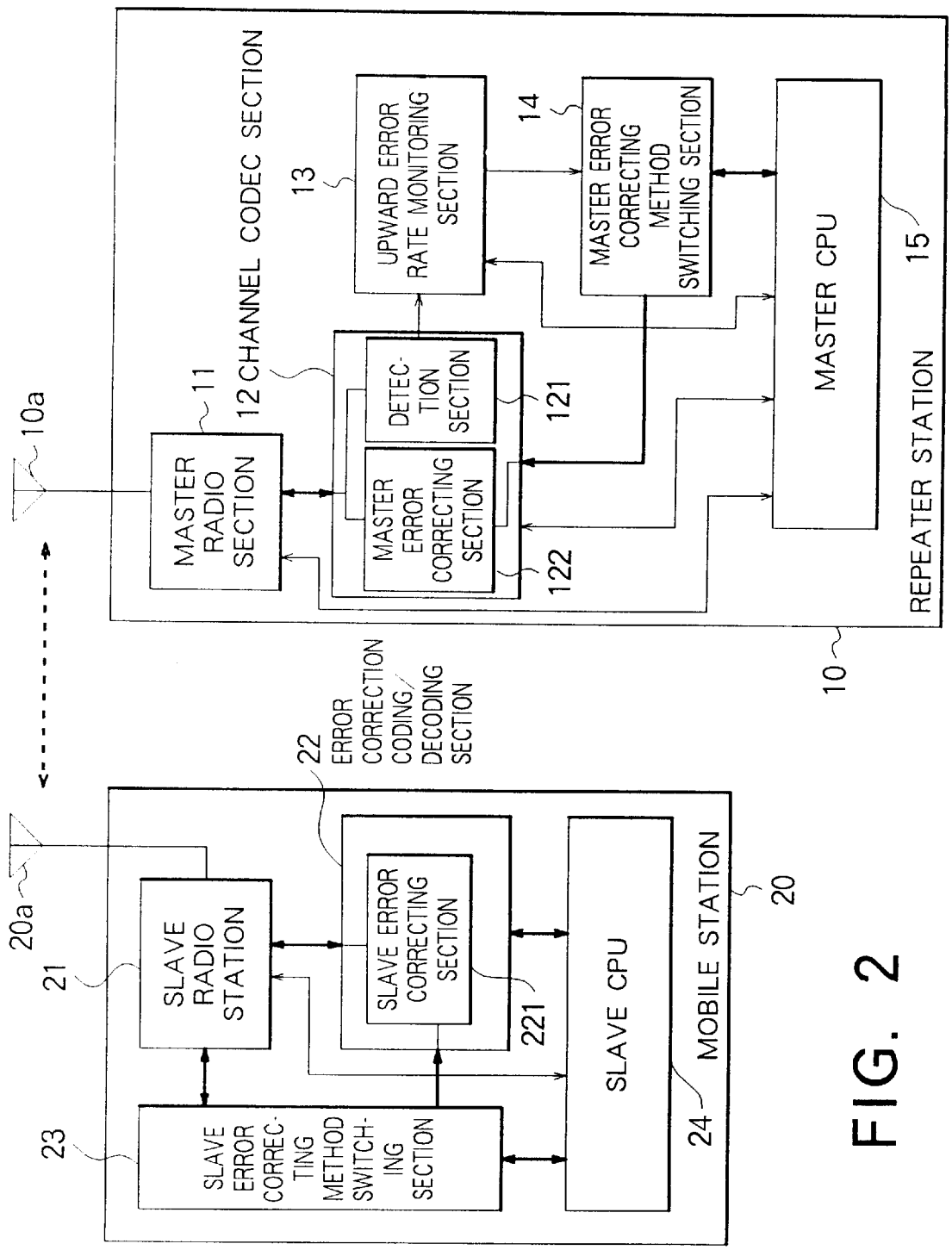
FIG. 2 is a block diagram of a repeater station and a mobile station (a fixed station) for use in the radio communication system illustrated in FIG. 1.

FIG. 2 is a block diagram of the repeater station 10 and the mobile station 20 for use in the radio communication system illustrated in FIG. 1, inasmuch as the fixed station 30 is similar in structure to the mobile station 20, illustration of the fixed station 30 is therefore omitted. The repeater station 10 has a master antenna 10a while the mobile station 20 has a slave antenna 20a.

The repeater station 10 comprises a master radio section 11, a channel coding/decoding (CODEC) section 12, an upward error rate monitoring section 13, a master error correcting method switching section 14, and a master central processing unit (CPU) 15. The master radio section 11 is called a main radio section, the master error correcting method switching section 14 is called a main error correcting method switching section, and the master CPU 15 is called a main CPU.

The master radio section 11 is connected to the master antenna 10a and is in radio communication with the mobile stations 20 and the fixed stations 30. The channel CODEC section 12 is connected to the master radio section 11. The channel CODEC section 12 decodes a signal received by the master radio section 11. The channel CODEC section 12 comprises a detection section 121 for detecting the upward error rate of the upward transmission path $P_U$ to produce the detected error rate. The upward error rate monitoring section 13 is connected to the detection section 121 in the channel CODEC section 12. The upward error rate monitoring section 13 acts as a comparison arrangement for comparing the detected error rate with a predetermined reference value. The upward error rate monitoring section 13 produces degradation information when the detected error rate is larger the predetermined reference value. The master error correcting method switching section 14 is connected to the upward error rate monitoring section 13 and to the channel CODEC section 12. Responsive to the degradation information, the master error correcting method switching section 14 supplies the channel CODEC section 12 with a switch control signal to make the channel CODEC section 12 switch the master error correcting methods from one to another. The master CPU 15 is connected to the master radio section 11, the channel CODEC section 12, the upward error rate monitoring section 13, and the master error correcting method switching section 14. The master CPU 15 controls the master radio section 11, the channel CODEC section 12, the upward error rate monitoring section 13, and the master error correcting method switching section 14.

The channel CODEC section 12 comprises a master error correcting section 122 includes the master error correcting methods to enable to carrying out a plurality of types of error correction coding/decoding. The master error correcting section 122 selects one of the master error correcting methods in response to the switch control signal to set a selected master error correcting method therein. The master error correcting section 122 carries out the error correction decoding on the signal received by the master radio section 11 using the selected master error correcting method. In addition, the master error correcting section 122 carries out the error correction coding on a signal to be send using the selected master error correcting method to supply an error correction coded signal with the master radio section 11. The master radio section 11 sends the switch control signal via the downward transmission path $P_D$ to the mobile stations 20 and the fixed stations 30. That is, the master radio section 11 is operable in cooperation with the channel CODEC section 12 as a sending arrangement for sending the switch control signal via the downward transmission path $P_D$ to the slave stations.

In the example being illustrated, the master error correcting methods in the master error correcting section 121 use master error correcting codes, respectively, which are different from each other. Such master error correcting codes may, for example, be a block code, a convolution code, a random error correcting code, a burst error correcting code, a byte error correcting code, and so on. The master error correcting section 121 selects, as a selected master error correcting code, one of the master error correcting codes in response to the switch control signal and carries out error correction operation using the selected master error correcting code.

At any rate, a combination of the detection section 121 of the channel CODEC section 12, the upward error rate monitoring section 13, the master error correcting method switching section 14 serves as a selection arrangement for selecting one of the master error correcting methods in accordance with a line quality of the radio transmission path.

The mobile station 20 comprises a slave radio section 21, an error correction coding/decoding section 22, a slave error correcting method switching section 23, and a slave CPU 24. The slave radio section 21 is called a sub radio section, the slave error correcting method switching section 23 is called a sub error correcting method switching section, and the slave CPU 24 is called a sub CPU.

The slave radio section 21 is connected to the slave antenna 20a and is in radio communication with the repeater station 10. The error correction coding/decoding section 22 is connected to the slave radio section 21 and comprises a slave error correcting section 221 which is similar in structure to the master error correcting section 122. That is, the slave error correcting section 221 includes a plurality of slave error correcting methods which are identical with the master error correcting methods. The slave error correcting method switching section 23 is connected to the slave radio section 21 and the error correction coding/decoding section 22. When the slave radio section 21 receives the switch control signal in the received signal from the repeater station 10, the slave radio section 21 produces a received switch control signal. That is, the slave radio section 21 serves as a receiving arrangement for receiving the switch control signal to produce the received switch control signal. The received switch control signal is supplied to the slave error correcting method switching section 23. The slave error correcting method switching section 23 supplies the slave error correcting section 221 with the received switch control signal to make the slave error correcting section 221 switch the slave error correcting methods from one to another. The slave CPU 24 is connected to the slave radio section 21, the error correction coding/decoding section 22, and the slave error correcting method switching section 23. The slave CPU 24 controls the slave radio section 21, the error correction coding/decoding section 22, and the slave error correcting method switching section 23.

At any rate, a combination of the slave radio section 21 and the slave error correcting method switching section 23 acts as a selecting arrangement for selecting one of the slave error correcting methods in accordance with the line quality of the radio transmission path.

In the example being illustrated, the master error correcting methods prepared for the master error correcting section 122 of the channel CODEC section 12 are assigned with sequence numbers for selections. In addition, the slave error correcting methods prepared for the slave error correcting section 221 in the error correction coding/decoding section 22 are assigned with sequence numbers for selections that are equal to those of the master error correcting methods. Both of the master error correcting methods and the slave error correcting methods are sequentially and simultaneously selected in order of the sequence numbers.

Figure 3:
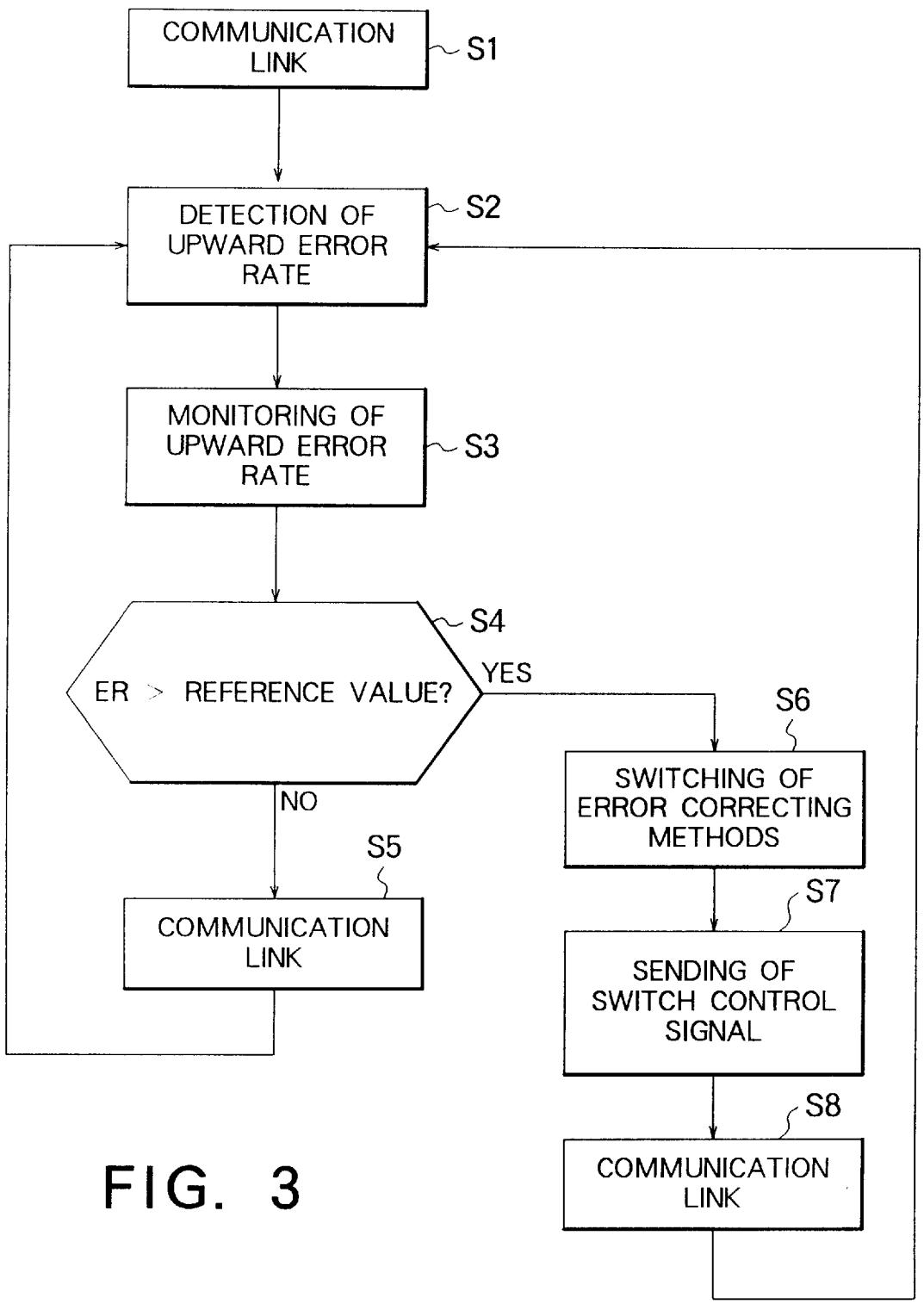
FIG. 3 is a flow chart for use in describing operation of error correction control in the radio communication system illustrated in FIG. 1.

Referring to FIG. 3 in addition to FIGS. 1 and 2, description will proceed to operation of error correction control in the radio communication system illustrated in FIG. 1.

At a first step S1, radio transmission is carried out in the radio transmission system using the error correcting code of a first sequence number which is preliminarily set therein. The first step S1 is succeeded by a second step S1 at which the detection section 121 of the channel CODEC section 12 in the repeater station 10 always detects the upward error rate for the upward transmission path $P_U$ to produce the detected error rate denoted by ER. The second step S2 proceeds to third and fourth steps S3 and S4 at which the upward error rate monitoring section 13 of the repeater station 10 monitors the detected error rate BER to compare the detected error rate ER with the predetermined reference value. When the detected error rate BER is not larger than the predetermined reference value, the fourth step S4 is followed by a fifth steps S5 at which the radio transmission is continued using a current error correcting code or the error correcting code having the first sequence number because the line quality of the radio transmission path is good. The fifth step S5 is turned back to the second step S2.

When the detected error rate BER is larger than the predetermined reference value, the fourth step S4 is succeeded by a sixth step S6 at which the upward error rate monitoring section 13 produces the degradation information because the line quality of the radio transmission path is degraded. Responsive to the degradation information, the master error correcting method switching section 14 supplies the channel CODEC section 12 with the switch control signal to make the channel CODEC section 12 switch from the master error correcting code having the first sequence number to another master error correcting code having a second sequence number. The sixth step S6 proceeds to a seventh step S7 at which the master radio section 11 sends the switch control signal via the downward transmission path $P_D$ to the mobile stations 20. Thereafter, the master error correcting section 122 in the channel CODEC section 12 performs error correction coding/decoding using a switched master error correcting code or the master error correcting code having the second sequence number at an eighth step S8 following to the seventh step S7.

In the mobile station 20, the slave radio section 21 receives the switch control signal to produce the received switch control signal. The received switch control signal is supplied to the slave error correcting method switching section 23. The slave error correcting method switching section 23 supplies the slave error correcting section 221 of the error correction coding/decoding section 22 with the received switch control signal to make the slave error correcting section 221 switch from the slave error correcting code having the first sequence number to another slave error correcting code having a second sequence number. A switched slave error correcting code or the slave error correcting code having the second sequence number is identical with the switched master error correcting code. Thereafter, the mobile station 20 is in radio communication with the repeater station 10 using the switched slave error correcting code.

As described above, radio transmission is carried out between the repeater station 10 and the mobile station 20 in synchronism with the switching of the error correcting codes in accordance with the line quality of the radio transmission path. Inasmuch as the line quality of the radio transmission path is always monitored, the radio transmission based on the optimum error correcting method due to cause of degradation or the error correcting method having the minimum error rate is ensured although the cause of the degradation for the radio transmission path changes variously. Thus, it is possible to keep transmission efficiency high without falling a bit rate ratio in vain.

Although description has been made as regards operation of the radio transmission between the repeater station 10 and the mobile station 20, operation is similar to radio transmission between the repeater station 10 and the fixed station 30. In addition, in the radio transmission system of the large zone type, the above-mentioned error correction control may be independently carried out for individual mobile stations 20 and individual fixed stations 30 to switch the error correcting methods within a necessary area alone. Specifically, the repeater station 10 has a service area which is divided into a middle section and a peripheral section. Inasmuch as the middle section of the service area is less subject to degradation of the line quality, necessity for error correcting is eliminated in the middle section of the service area. On the other hand, the necessity of the error correcting increases in the peripheral section of the service area. This is because the peripheral area of the service area is susceptible to the degradation of the line quality. Under the circumstances, it is hardly necessary to switch the error correcting methods in the middle section of the service area and the switching of the error correcting methods may be carried out in the peripheral section of the service area. It results in preventing the switching wastefully.

While this invention has thus far been described in conjunction with a preferred embodiment thereof, it will readily be possible for those skilled in the art to put this invention into practice in various other manners. For example, the radio transmission system may be a mobile communication system comprising a base station as the master station and a plurality of mobile stations as the slave station.

What is claimed is:

1. A radio transmission system comprising a master station and a plurality of slave stations connected to said master station via a radio transmission path which consists of an upward transmission path from said slave stations two said master station and a downward transmission path from said master station to said slave stations, said master station comprising:

detection means for detecting an upward error rate for the upward transmission path to produce a detected error rate;

master error correcting means including a plurality of master error correcting methods;

comparison means, connected to said detection means, for comparing the detected error rate with a predetermined reference value to produce degradation information when the detected error rate is larger than the predetermined reference value;

master switching means, connected to said comparison means and said master error correcting means, for supplying, in response to the degradation information, said master error correcting means with a switch control signal to make said master error correcting means switch said master error correcting methods from one to another; and sending means, connected to said master switching means, for sending the switch control signal via the downward transmission on path to said slave stations, each of said slave stations comprising:

reception means for receiving the switch control signal to produce a received switch control signal;

slave error correcting means including a plurality of slave error correcting methods which are identical with the master error correcting methods; and slave switching means, connected to said reception means and said slave error correcting means, for supplying said slave error correcting means with the received switch control signal to make said slave error correcting means switch said slave error correcting methods from one to another.

2. A radio transmission system as claimed in claim 1, wherein said radio transmission system is an MCA system comprising a repeater station as said master station and, as said slave stations, a plurality of mobile stations and a plurality of fixed stations.

3. A radio transmission system as claimed in claim 1, wherein said radio transmission system is a mobile communication system comprising a base station as said master station and a plurality of mobile stations as said slave stations.

4. A radio transmission system as claimed in claim 1, wherein both of said master error correcting methods and said slave error correcting methods are assigned with sequence numbers of selections, whereby switching of said master error correcting methods and switching of said slave error correcting methods are sequentially and simultaneously carried out in order to the sequence numbers.

5. A radio transmission system as claimed in claim 1, wherein both of said master error correcting methods and said slave error correcting methods use error correcting codes, respectively, which are different from each other.

6. A method of controlling error correction in a radio transmission system comprising a master station and a plurality of slave stations connected to said master station via a radio transmission path which consists of an upward transmission path from said slave stations to said master station and a downward transmission path from said master station to said slave stations, said master station comprising master error correcting means including a plurality of master error correcting methods, each of said slave stations comprising slave error correcting means including a plurality of slave error correcting methods which are identical with the master error correcting methods, said method comprising the steps of:

detecting, in said master station, an error rate for the upward transmission path to produce a detected error rate;

comparing, in said master station, the detected error rate with a predetermined reference value to produce degradation information when the detected error rate is larger than the predetermined reference value;

supplying, in said master station, said master error correcting means with a switch control signal in response to the degradation information to make said master error correcting means switch said master error correcting methods from one to another;

sending the switch control signal from said master station to said slave stations via the downward transmission path;

receiving, each of said slave stations, the switch control signal to produce a received switch control signal; and supplying, each of said slave stations, said slave error correcting means with the received switch control signal to make said slave error correcting means switch said slave error correcting methods from one to another.

7. A method as claimed in claim 6, wherein both of said master error correcting methods and said slave error correcting methods are assigned with sequence numbers of selections, whereby switching of said master error correcting methods and switching of said slave error correcting methods are sequentially and simultaneously carried out in order to the sequence numbers.

8. A method as claimed in claim 6, wherein both of said master error correcting methods and said slave error correcting methods use error correcting codes, respectively, which are different from each other.

* * * * *